(12) United States Patent
Hayashi

(10) Patent No.: US 6,388,733 B1
(45) Date of Patent: May 14, 2002

(54) EXPOSURE APPARATUS WITH AN ANTI-VIBRATION STRUCTURE

(75) Inventor: Yutaka Hayashi, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/266,009

(22) Filed: Mar. 11, 1999

Related U.S. Application Data

(62) Division of application No. 08/624,358, filed on Apr. 11, 1996, now abandoned.

(30) Foreign Application Priority Data

Apr. 14, 1995 (JP) ............................................. 7-089403

(51) Int. Cl.⁷ .......................... G03B 27/42; G03B 27/54
(52) U.S. Cl. ............................. 355/53; 355/67; 355/71
(58) Field of Search .............................. 355/53, 67, 70, 355/71; 248/638; 356/399, 400, 401

(56) References Cited

U.S. PATENT DOCUMENTS

| | | | |
|---|---|---|---|
| 4,370,054 A | 1/1983 | Isohata et al. | 355/53 |
| 4,496,239 A | 1/1985 | Isohata et al. | 355/53 |
| 4,553,834 A | 11/1985 | Ayata et al. | 355/53 |
| 4,668,077 A * | 5/1987 | Tanaka | 355/53 |
| 4,724,466 A | 2/1988 | Ogawa et al. | 355/53 |
| 4,748,477 A | 5/1988 | Isohata et al. | 355/53 |
| 4,796,873 A | 1/1989 | Schubert | 267/136 |
| 4,803,712 A | 2/1989 | Kembo et al. | 378/34 |
| 4,805,000 A | 2/1989 | Ogawa et al. | 355/43 |
| 4,851,882 A * | 7/1989 | Takahashi et al. | 355/53 |
| 4,864,360 A | 9/1989 | Isohata et al. | 355/53 |
| 4,989,031 A | 1/1991 | Kamiya | 355/53 |
| 4,998,134 A | 3/1991 | Isohata et al. | 355/53 |
| 5,150,153 A | 9/1992 | Franken et al. | 355/53 |
| 5,187,519 A | 2/1993 | Takabayashi et al. | 355/53 |
| 5,204,711 A * | 4/1993 | Takubo et al. | 355/53 |
| 5,359,389 A | 10/1994 | Isohata | 355/53 |
| 5,379,090 A * | 1/1995 | Shiraishi | 355/67 |
| 5,446,519 A | 8/1995 | Makinouchi | 355/53 |
| 5,675,401 A * | 10/1997 | Wangler et al. | 355/67 |
| 6,327,024 B1 | 12/2001 | Hayashi et al. | 355/53 |

FOREIGN PATENT DOCUMENTS

| | | |
|---|---|---|
| GB | 1 315 256 | 10/1971 |
| GB | 2 249 189 A | 4/1992 |
| JP | 64-37837 | 2/1989 |

* cited by examiner

Primary Examiner—Alan A. Mathews
(74) Attorney, Agent, or Firm—Armstrong, Westerman & Hattori, LLP

(57) ABSTRACT

An exposure apparatus has an illumination optical system 37 an exposure machine main portion (29). The illumination optical system (37) includes, for example, a cooling fan (43) and mounted on an independent column (36) which is fixedly mounted on a floor (1). The exposure machine main portion (29) includes a reticle stage (27), a projection optical system (25), a wafer stage (20), first and second support columns (24 and 26) and a platen (6). The exposure machine main portion (29) is mounted on the floor (1) through height adjustors (3A–3D) and the associated vibration isolators (4A–4D) and capable of six-degree-of-freedom displacement by means of actuators (7A, 7B and 32A–32C). Capacitor type sensors (44A and 44B) are provided between the independent column (36) and the second column (26) for detecting any misalignment and the distance between the illumination optical system (37) and the exposure machine main portion (29). The relative position of the illumination optical system (37) and the exposure machine main portion (29) is controlled by a controller (11) based on the misalignment and the distance detected. In this manner, any vibrations and shakings of the illumination optical system as produced by the cooling fan for removing the heat generated in the exposure light source is transferred only to the independent column (36) and not to the exposure machine main portion (29), resulting in an enhanced alignment accuracy between the mask (reticle) and the photosensitized substrate (wafer).

101 Claims, 5 Drawing Sheets

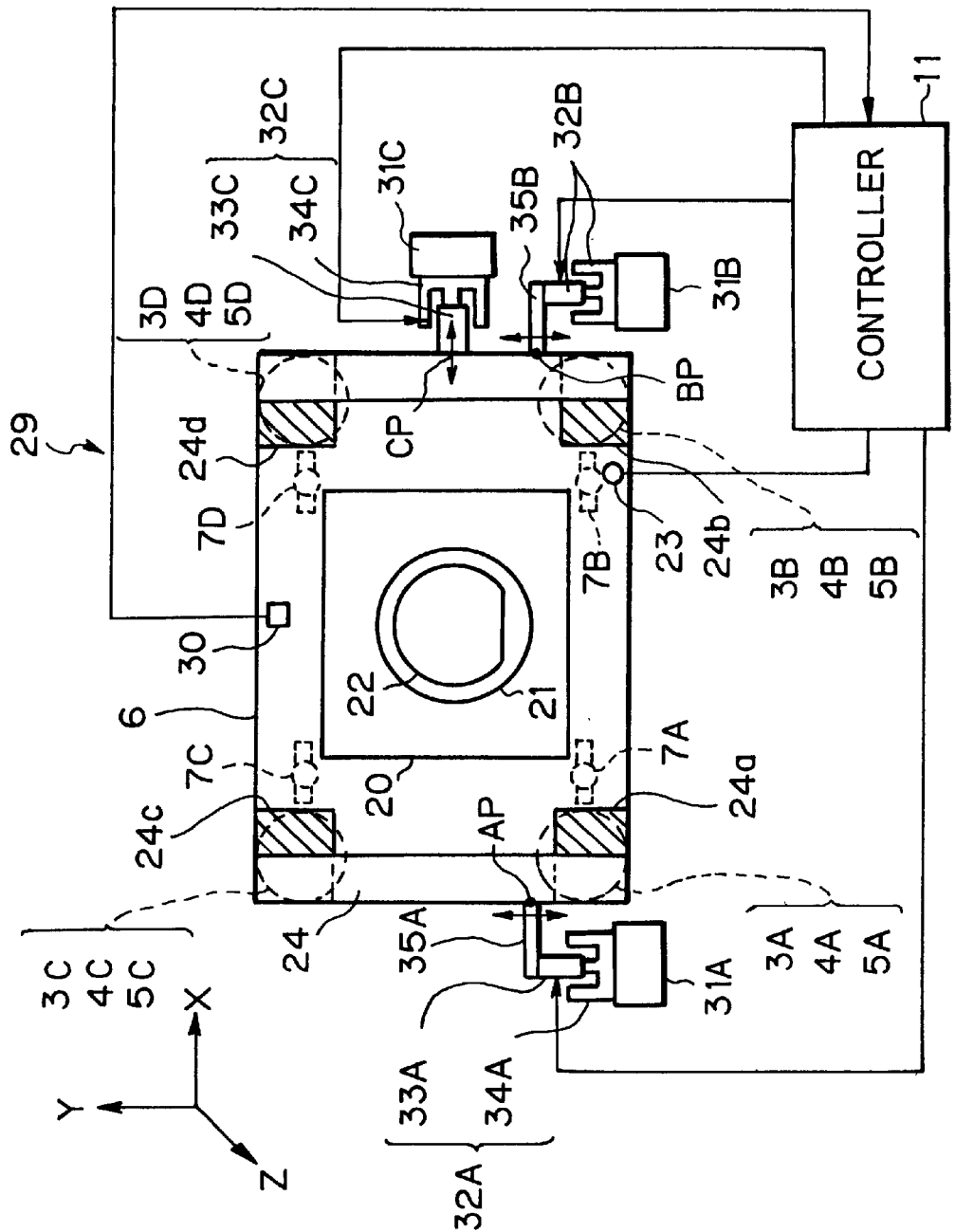

EXPOSURE APPARATUS WITH AN ANTI-VIBRATION STRUCTURE

This application is division of prior application Ser. No. 08/624,358 filed Apr. 11, 1996, now abandoned.

BACKGROUND OF THE INVENTION

1. Field of the Invention

The present invention relates to an exposure apparatus for printing a pattern formed on a mask onto a photosensitized substrate such a photoresist-coated wafer, and particularly suitable for use with such an exposure apparatus having an illumination optical system including a vibration source.

2. Description of the Related Art

There have been used various exposure apparatuses (including steppers) for a photolithographic process in the fabrication of semiconductor devices, liquid crystal displays or the like, in which a pattern on a reticle (or mask) is transferred by exposure onto each shot area on a photoresist-coated wafer (or glass plate). In a one-shot exposure type of exposure apparatus such as a stepper, in order to print a pattern formed on a reticle onto each shot area on a wafer, the reticle and the wafer have to be held almost completely stationary. For this purpose, such an exposure apparatus has its platen (or its surface block) mounted on a floor through vibration isolators so as to substantially prevent any harmful vibrations from transmitting from the floor to the platen and to the portion of the exposure apparatus on the platen (i.e, the main portion of the exposure apparatus).

Recently, exposure apparatuses using the scanning projection exposure technique (such as the step-and-scan type of exposure apparatus) have drawn engineers' attention because they enable transferring a significantly larger pattern formed on a reticle onto a wafer, without the need for a larger size of projection optical system. In the scanning projection exposure apparatus, the reticle is moved in a direction perpendicular to the optical axis of the projection optical system for scanning, while the wafer is moved in synchronism with the reticle and in a direction corresponding to the direction of the movement of the reticle for scanning, with the ratio between the velocities of the reticle and the wafer being equal to the demagnification ratio of the projection optical system, so that the pattern on the reticle is serially transferred by exposure onto the wafer. In the scanning projection exposure apparatus with such arrangement, vibration isolators have to be used to reject any harmful vibrations which would otherwise transmitted from the floor, in order to ensure that the reticle and the wafer may be moved for scanning at constant velocities with stability during the scanning exposure operation.

FIG. 5 is a schematic representation, partially cutaway, showing a typical stepper type of exposure apparatus. As shown in FIG. 5, the exposure apparatus has an illumination optical system 37 comprising an illumination system lens barrel 42 and other components mounted on the illumination system lens barrel 42, the components including a light source 39 such as a mercury-vapor lamp, a relay lens 40A, a reticle blind (field stop) 41, condenser lens 40B, and a cooling fan 43 with a casing 43A covering the cooling fan 43 for introducing cooled air through a cooling-air duct 38 into the illumination system lens barrel 42. The illumination optical system 37 comprises further components including an optical integrator, but they are not shown in the figure for simplicity. Below the illumination optical system 37, there are disposed, from upper to lower positions in the following order, a reticle stage 27 for carrying a reticle, a projection optical system 25, and a wafer stage 20 for carrying a wafer 22.

The projection optical system 25 is directly mounted on a first column 124, the reticle stage 27 is mounted to the first column 124 through a second column 126, and the illumination system lens barrel 42 confining the components of the illumination optical system is mounted to the first column 124 through a third column 136. The first column 124, in turn, is fixedly mounted on a platen 106 (or a surface block 106). The wafer stage 20 carrying the wafer 22 is also mounted on the platen 106. The platen 106, the wafer stage 20, the first column 124, the projection optical system 25, the second column 126 and the reticle stage 27 together compose the main portion of the exposure apparatus. Accordingly, the illumination optical system 25 is mounted to the main portion of the exposure apparatus through the third column 136.

There are disposed on the floor 1 three or four base plates (of which FIG. 5 shows only two base plates 102A and 102B), on which three or four vibration isolators (of which FIG. 5 shows only two vibration isolators 111A and 111B) are mounted one on each base plate, for supporting the platen 106. The exposure apparatus further includes various alignment systems for establishing the alignment between the reticle 28 and the wafer 9, which alignment systems are, however, not shown in the figure.

In this conventional arrangement, the illumination optical system 37 is directly connected to the main portion of the exposure apparatus, that is, an integral structure is used. This arrangement, however, generates various sorts of vibrations, one of which is the vibration produced by the cooling fan 43 for removing the heat generated by the light source 39 and transmitted to the illumination optical system 37, and the others of which are the vibrations produced by a fan in an air conditioning system and/or by a pump for a water-cooling system. Therefore, this arrangement suffers from a drawback that such vibrations will be transferred to the stage system such as the wafer stage 20, so that the alignment accuracy of the exposure apparatus and the positioning accuracy for positioning the stage are deteriorated thereby.

SUMMARY OF THE INVENTION

It is an object of the present invention to provide an exposure apparatus capable of positioning a wafer with precision and without being influenced by any vibrations produced for example by a cooling fan for cooling an exposure light source of an illumination optical system, by virtue of an arrangement wherein the vibrations are transferred to an independent column separate from the main portion of the exposure apparatus, and thereby the vibrations are prevented from being transferred to an alignment system and a stage system provided on the main portion of the exposure apparatus.

It is another object of the present invention to provide an exposure apparatus capable of positioning a wafer with further precision, by virtue of an arrangement wherein a misalignment detection mechanism is provided between the illumination optical system and the exposure machine main portion (which are separated from each other) for detecting any misalignment between them, and the misalignment detection mechanism is used to detect not only the vibrations produced for example by the cooling fan but also any misalignment which may be caused by the vibrations as produced by the movement of a reticle stage and/or a wafer stage, and to cancel out any of such vibrations by correction.

In order to achieve the above and other objects, according to the present invention, as shown in FIG. 1, there is provided an exposure apparatus for transferring a pattern formed on a mask (28) onto a photosensitized substrate (22), comprising: an illumination optical system (37) for illuminating the mask (28) with an exposure illumination beam (IL); an exposure machine main portion (29) serving to hold the mask (28) and the photosensitized substrate (22); and first and second support structures on which the illumination optical system (37) and the exposure machine main portion (29) are mounted, respectively, the first and second support structures being separate from each other.

In this arrangement, it may be preferable that: the second support structure on which the exposure machine main portion (29) is mounted comprises a vibration isolation structure (3A, 3B, 4A, 4B, 5A, 5B, 6, 7A, 7B, 31A, 31B, 32A, 32B, 35A, 35B) capable of six-degree-of-freedom position and orientation control; the exposure apparatus further comprises a position detection mechanism (44A, 44B) for detecting any misalignment between the illumination optical system (37) and the exposure machine main portion (29); and the position and orientation of the vibration isolation structure are controlled based on detected values from the position detection mechanism (44A, 44B).

In addition, the illumination optical system (37) may preferably further comprise a field stop (41) for limiting an illumination area on the mask (28) and the field stop (41) is fixedly mounted on the exposure machine main portion (29).

According to the exposure apparatus of the present invention with the above arrangement, because the illumination optical system (37) and the exposure machine main portion (29) are mounted on the separate first and second support structures, any vibrations and shakings of the illumination optical system (37) which may be produced for example by the cooling fan and other components which are generally mounted on the illumination optical system (37) as integral components will not influence upon the alignment accuracy between the mask (28) and the photo-sensitized substrate (22), so that the alignment is achieved with precision.

In the case where the second support structure on which the exposure machine main portion (29) is mounted comprises a vibration isolation structure (3A, 3B, 4A, 4B, 5A, 5B, 6, 7A, 7B, 31A, 31B, 32A, 32B, 35A, 35B) capable of six-degree-of-freedom position and orientation control, where the exposure apparatus further comprises a position detection mechanism (44A, 44B) for detecting any misalignment between the illumination optical system (37) and the exposure machine main portion (29), and where the position and orientation of the vibration isolation structure are controlled based on detected values from the position detection mechanism (44A, 44B), then, the position detection means (44A, 44B) can be used to measure any misalignment between the illumination optical system (37) and the exposure machine main portion (29), and the vibration isolation structure having six-degree-of-freedom can be used to control the position and orientation of the exposure machine main portion (29) with precision so as to correct any misalignment between the exposure machine main portion (29) and the illumination optical system (37).

In the case where the illumination optical system (37) further comprises a field stop (41) for limiting an illumination area on the mask (28) and the field stop (41) is fixedly mounted on the exposure machine main portion (29), the relative position of the field stop (41) and the exposure machine main portion (29) remains unchanged even when a misalignment occur between the illumination optical system (37) and the exposure machine main portion (29), so that the illumination area can be maintained stationary.

BRIEF DESCRIPTION OF THE DRAWINGS

The above and other objects, features and advantages of the present invention will be apparent from the following detailed description of preferred embodiments thereof, reference being made to the accompanying drawings, in which:

FIG. 3 is a sectional view taken along line A—A in FIG. 1;

DETAILED DESCRIPTION OF PREFERRED EMBODIMENTS

Figure 1:
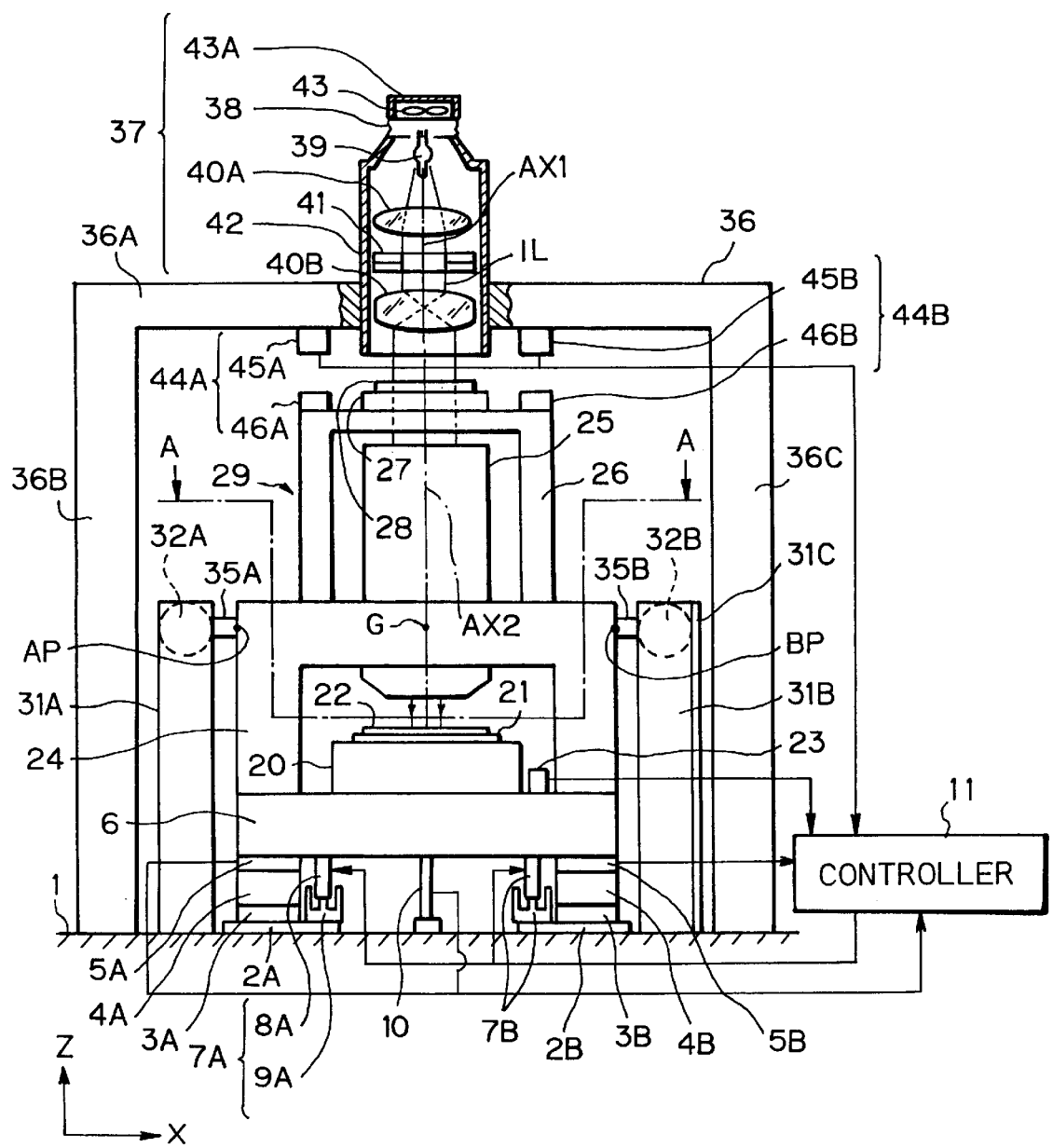
FIG. 1 is a schematic elevation, partially cutaway, showing an embodiment of an exposure apparatus in accordance with the present invention.
Figure 5:
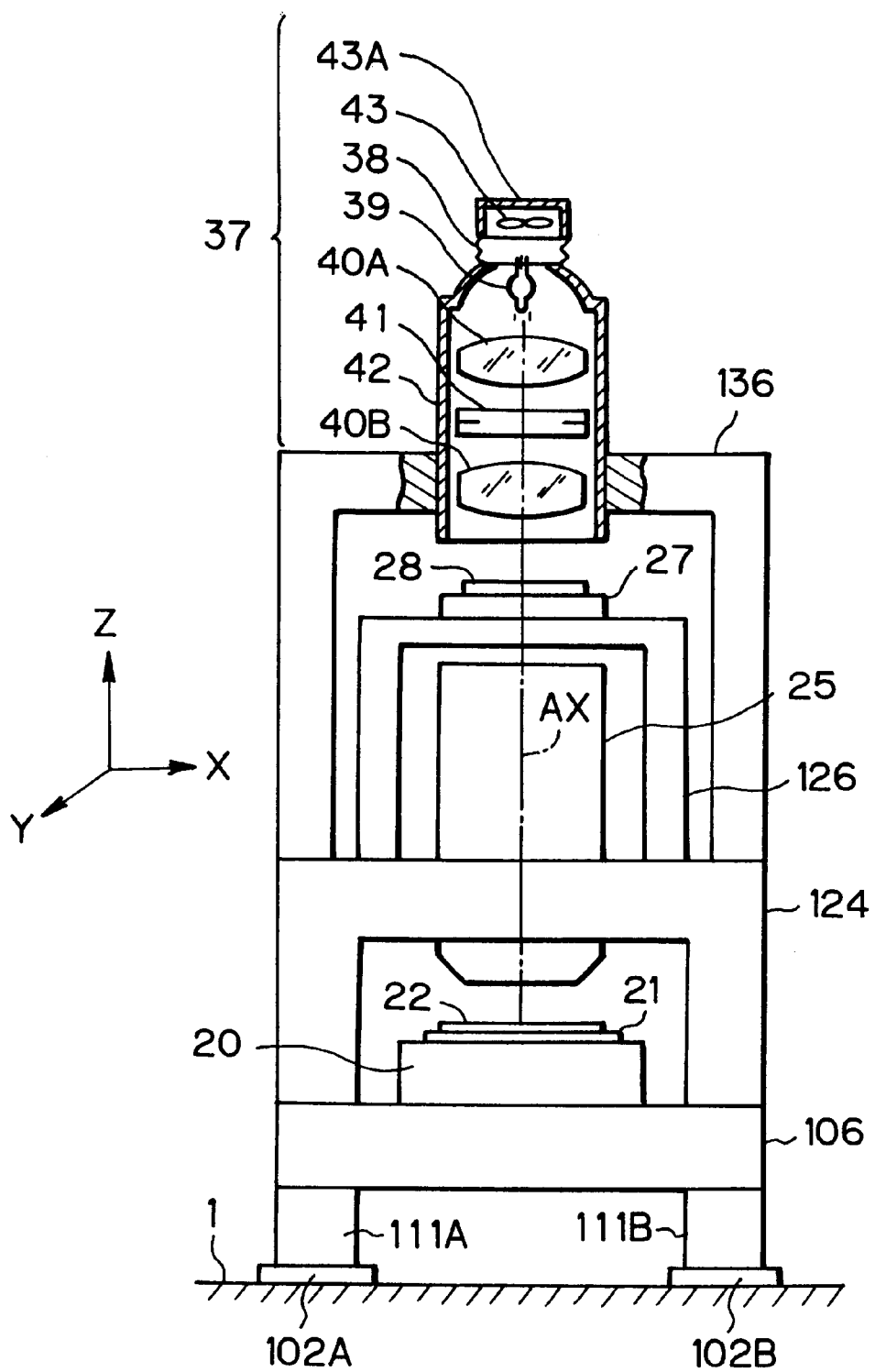
FIG. 5 is a schematic elevation, partially cutaway, showing a typical conventional exposure apparatus.

Referring now to FIGS. 1 to 3, an embodiment of an exposure apparatus in accordance with the present invention will be described in detail. This embodiment shows an exemplified application of the present invention to a step-and-repeat type of projection exposure apparatus in which a pattern on a reticle is transferred by exposure onto each shot area on a wafer through a projection optical system, with demagnification of the transferred pattern being effected. In FIG. 1, corresponding components and elements are designated by the same reference numerals as in FIG. 5 and will not be described in detail.

FIG. 1 is a schematic elevation, partially cutaway, showing the arrangement of the projection exposure apparatus of this embodiment. As shown in FIG. 1, an illumination optical system 37 emits an illumination beam IL which illuminates an illumination area on a reticle 28, and a circuit pattern drawn within the illumination area is transferred through a projection optical system 25, with demagnification of the transferred pattern being effected. The projection optical system 25 has an optical axis AX2. In order to specify positions and directions in the arrangement shown in FIG. 1, we use here a three-dimensional rectangular coordinate system with the X-, Y- and Z-axes. The Z-axis extends parallel to the optical axis AX2 of the projection optical system 25, the X-axis extends in a plane perpendicular to the optical axis AX2 and in a plane parallel to the paper surface of FIG. 1, and the Y-axis extends perpendicular to the paper surface of FIG. 1.

The illumination optical system 37 comprises an illumination system lens barrel 42 and other components mounted on the illumination system lens barrel 42, the components including a light source 39 such as a mercury-vapor lamp, an optical integrator (not shown), a relay lens 40A, a reticle blind (field stop) 41, a condenser lens 40B, and a cooling fan 43 with a casing 43A covering the cooling fan 43 for introducing cooled air through a cooling-air duct 38 into the illumination system lens barrel 42. The illumination optical system 37 has an optical axis AXI. The light source 39 may alternatively comprise an excimer laser (such as krypton-fluorine excimer laser or argon-fluorine excimer laser), metal vapor laser, or a harmonic generator of a YAG-laser.

Next, the exposure machine main portion 29 of the exposure apparatus of this embodiment, which excludes the illumination optical system 37, will be described in detail. In this embodiment, what is called exposure machine main portion 29 is the combination of a platen 6 and the components mounted on the platen 6 (or the surface block 6). In this exposure machine main portion 29, the reticle 28 having the circuit pattern drawn thereon is held on a reticle stage 27 by means of a vacuum chuck. The reticle stage 27 serves to move the reticle 28 in a two-dimensional plane (XY-plane) perpendicular to the optical axis AX2 of the projection optical system 25, and more particularly, it moves the reticle 28 in the X-direction, in the Y-direction and the rotational direction (θ-direction), so as to position the reticle 28 to a desired position. The coordinates of the position of the reticle stage 27 in the two-dimensional plane are continuously detected, with a resolution of about, for example, 0.01 μm, by means of the combination of movable mirrors (not shown) fixedly mounted on the reticle stage 27 and laser interferometers (not shown) mounted on a stationary member external to the reticle stage 27.

As shown in FIG. 1, the wafer 22 is held on a wafer holder 21 by means of a vacuum chuck, and the wafer holder 21 is carried on a wafer stage 20 which is movable in the X- and Y-directions. The wafer stage 20 is also tiltable in any direction relative to the image plane of the projection optical system 25 as well as capable of fine adjustment in the direction of the optical axis AX2 (i.e., in the Z-direction). The wafer stage 20 is further rotatable about the optical axis AX2. The X- and Y-coordinates of the wafer stage 20 are continuously detected by means of the combination of movable mirrors (not shown) fixedly mounted on the wafer stage 20 and laser interferometers (not shown) mounted on a stationary member external to the wafer stage 20.

There is also provided an oblique-incident-ray type of focusing position detection system comprising i) a projection optical system (not shown) for projecting an image of a pinhole-like or slit-like pattern onto the photosensitized surface of the wafer 22 placed nearly in the image plane of the projection optical system 25, by using a projection light ray which is oblique relative to the optical axis AX2, and ii) a light receive optical system (not shown) for receiving the reflected beam from the projected image and forming again an image of the image formed on the photosensitized surface of the wafer. The position of the surface of the wafer 22 in the Z-direction is detected by this focusing position detection system, and the auto-focusing operation is performed such that the surface of the wafer 22 may be made coincident with the image plane of the projection optical system 25. Further, the exposure apparatus of this embodiment is provided with other various alignment mechanisms (not shown) for aligning the reticle 28 and wafer 22 with each other, which alignment mechanisms will, however, not be described in detail.

Next, support structures used in the exposure apparatus of this embodiment will be described in detail.

In the exposure apparatus of this embodiment, the illumination optical system 37 including the illumination system lens barrel 42 is fixedly mounted on the floor 1 through an independent column 36 which is separate from the exposure machine main portion 29. The independent column 36 surrounds the exposure machine main portion 29 and comprises a horizontal support plate 36A supporting at its central portion the illumination system lens barrel 42, and legs 36B and 36C supporting the support plate 36A and fixed on the floor 1.

As shown in FIG. 1, four base plates 2A, 2B, 2C and 2D (of which only two base plates 2A and 2B are in the view of FIG. 1 and the other two are hidden) are disposed on the installation surface of the floor 1. (Note that some of components described below are hidden from the view of FIG. 1 as well). Four vibration isolators 4A, 4B, 4C and 4A are mounted on the four base plates 2A–2B, one on each, and with a height adjustor (3A, 3B, 3C or 3D) interposed between each base plate and the corresponding vibration isolator. The vibration isolators 4A–4D are connected to the platen 6 of the exposure machine main portion 29 with respective load sensors 5A, 5B, 5C and 5D interposed between the vibration isolators 4A–4D and the platen 6.

The platen 6 carries the wafer stage 20 fixedly mounted thereon. The platen 6 also carries a first column 24 which is upright and fixedly mounted on the platen 6 and surrounds the wafer stage 20. The first column 24 has a top plate carrying the projection optical system 25 which is fixedly mounted on the top plate and disposed at the central portion of the top plate. The top plate of the first column 24 also carries a second column 26 which is upright and fixedly mounted on the top plate of the first column 24 and surrounds the projection optical system 25. The second column 26 has a top plate carrying the reticle stage 27 which is fixedly mounted on the top plate and disposed at the central portion of the top plate, and on which the reticle 28 is held. As shown in FIG. 3, the first column 24 has four legs 24a, 24b, 24c and 24d and is connected with the platen 6 through the legs.

FIG. 3 shows a sectional view taken along line A—A in FIG. 1. As shown, the platen 6 has a rectangular shape in plan. The height adjustors 3A–3D, the vibration isolators 4A–4D and the load sensors 5A–5D are disposed at the four corners of the rectangular platen 6. The height adjustors 3A–3B each may comprise an electrically-powered height adjustor having a screw mechanism and an electric motor for driving the screw mechanism. The Z-direction positions (or the heights) to be established by the respective height adjustors 3A–3D are controlled by a controller 11 which provides the general control function to the entire apparatus. The vibration isolators 4A–4D each may comprise an air damper or a mechanical damper having a compression coil spring received in a cylinder filled with a hydraulic fluid for damping. Where the vibration isolators comprise air dampers which are expandable/contractible in their length (the size in the vertical direction) by varying the air pressure therein, the height adjustors 3A–3D can be omitted because such air dampers can provide the function of the height adjustors. The load sensors 5A–5D each may comprise a load cell using strain gages. The load sensors 5A–5D measures the loads imposed by the platen 6 onto the vibration isolators 4A–4D, which loads are equal to the respective reaction forces acting on the platen 6 in the Z-direction from the vibration isolators 4A–4D. The measured values representing these reaction forces are supplied to the controller 11.

Referring again to FIG. 1, an actuator 7A is interposed between the base plate 2A and the platen 6, and in parallel to the vibration isolator 4A. The actuator 7A comprises a stationary element fixedly mounted on the base plate 2A and a moving element fixedly connected to the platen 6 at the bottom surface thereof. In response to the command signal provided by the controller 11, the actuator 7A produces a pushing force acting on the bottom of the platen 6 in the Z-direction away from the base plate 2A or a pulling force acting on the bottom of the platen 6 in the direction toward the base plate 2A. Similarly, the other vibration isolators 4B–4D have respective actuators 7B–7D associated therewith. The pushing/pulling forces of the actuators 7A–7D are individually controlled by the controller 11. The actuators 7A–7D are identically the same in construction, and therefore only the construction of the actuator 7A will be described in more detail below.

Figure 2A:
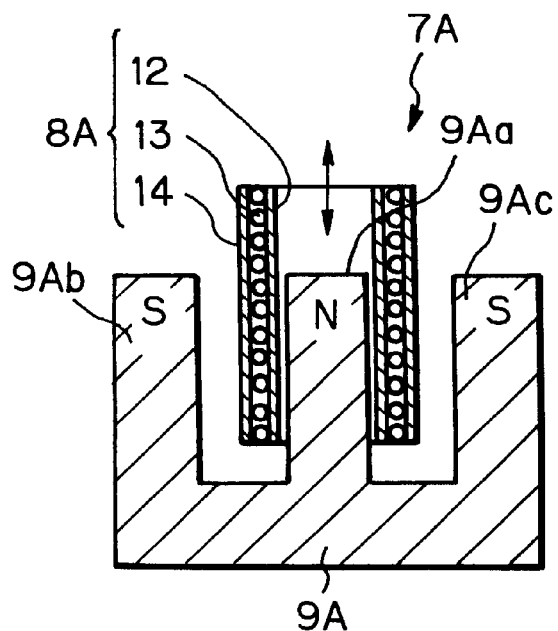
FIG. 2(a) is an enlarged sectional elevation showing an exemplified arrangement usable for the actuator 7A in FIG. 1

FIG. 2(a) shows an arrangement of the actuator 7A usable with this embodiment. As shown in FIG. 2(a), the stationary element 9A comprises a magnetic member having three parallel fingers including a center finger 9Aa defining a north-pole and a pair of side fingers 9Ab and 9Ac extending on the opposite side to the center finger 9Aa and defining south-poles. The moving element 8A comprises a bobbin 12 loosely fit on the center finger 9Aa, a solenoid 13 wound around the bobbin 12 and an outer cover 14 covering the solenoid 13. By controlling the current flowing through the solenoid 13, controlled forces are produced in the longitudinal direction of the center finger 9Aa (i.e., in the ±Z-direction) between the stationary element 9A and the moving element 8A as shown by double-headed arrow in FIG. 2(a).

Figure 2B:
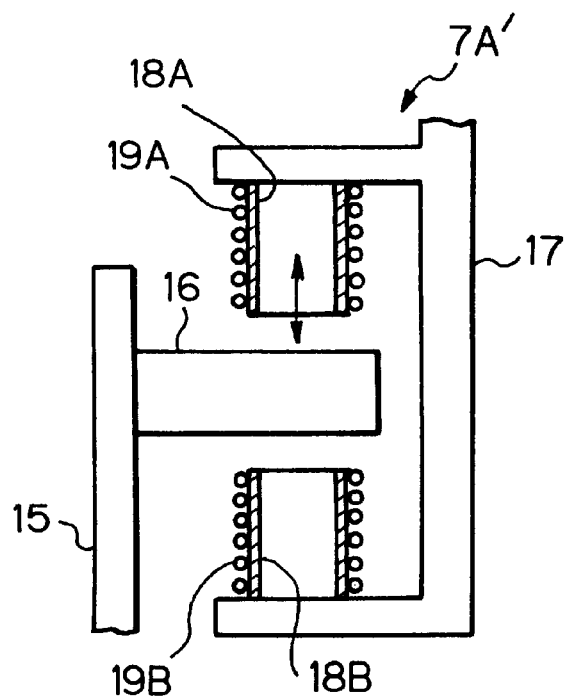
FIG. 2(b) is an enlarged sectional elevation showing another exemplified arrangement usable for the actuator 7A in FIG. 1.

FIG. 2(b) shows an alternative arrangement of the actuator 7A' also usable with this embodiment. As shown in FIG. 2(b), the actuator 7A' comprises a first member 15 carrying a stationary member 16 of magnetic material fixedly mounted thereon, and a second member 17 carrying a pair of bobbins 18A and 18B around which respective solenoids 19A and 19B are wound. Like the actuator 7A of FIG. 2(a), by controlling the current flowing through the solenoids 19A and 19B, controlled forces are produced between the first member 15 and the second member 17.

Referring again to FIG. 1, a pair of capacitance type sensors 44A and 44B are provided between the independent column 36 and the second column 26 and are disposed on opposite sides to the illumination system lens barrel 42 which is mounted on the support plate 36A of the independent column 36, each for detecting any misalignment in the X- and Y-directions, as well as the distance, between the illumination optical system 37 and the exposure machine main portion 29. Each of the capacitance type sensors 44A and 44B comprises a capacitance detection unit (45A or 45B) mounted on the bottom of the support plate 36A facing the reticle stage 27 and an electrode (46A or 46B) mounted on the second column 26 supporting the reticle stage 27.

The capacitance type sensors 44A and 44B have a measurement accuracy of the order of several $\mu$m. The lateral misalignments and the distances between the illumination optical system 37 and the exposure machine main portion 29 as measured by means of the respective capacitance type sensors 44A and 44B are used to determine not only the misalignment in the X- and Y-directions between the illumination optical system 37 and the exposure machine main portion 29 but also the relative tilt of angular misalignment between them. The measurements from the capacitance type sensors 44A and 44B are supplied to the controller 11, which uses the measurements to perform the control such that the relative position of the illumination optical system 37 and the exposure machine main portion 29 may be kept at a fixed relative position.

A displacement sensor 10 is provided between the floor 1 and the central portion of the bottom of the platen 6 in order to detect any relative displacement in the Z-direction of the platen 6 to the floor 1. The detection results from the displacement sensor 10 are also supplied to the controller 11. The displacement sensor 10 may comprise a potentiometer or a photoelectric linear encoder having a resolution of about 0.1 mm.

As shown in FIG. 3, the first column 24 has four legs 24a, 24b, 24c and 24d and is connected with the platen 6 through the legs. A level sensor 23 for detecting the tilt angle of the platen 6 with respect to a horizontal plane and an acceleration sensor 30 for detecting the accelerations of the platen 6 are disposed on the platen 6 near the wafer stage 20. The detection results from the level sensor 23 and the acceleration sensor 30 are supplied to the controller 11. The acceleration sensor 30 is capable of detecting not only linear accelerations in the X-, Y- and Z-directions, but also rotational accelerations for the rotation in the XZ-plane (or pitching), the rotation in the YZ-plane (or rolling) and the rotation in the XY-plane (or yawing). That is, the acceleration sensor 30 is capable of detecting the accelerations in the six-degree-of-freedom motion.

A movable rod 35A (see FIGS. 1 and 3) is fixedly mounted on one of the four sides of the first column 24 facing toward the −X-direction, and an actuator 32A is provided between the movable rod 35A and a stationary bracket 31A fixedly mounted on the floor 1. The actuator 32A, as shown in FIG. 3, has its construction similar to that of the actuator 7A, and comprises a stationary element 34A made of a magnetic member, and a moving element including a solenoid fixed to the movable rod 35A. When the controller 11 controls the current flowing through the solenoid of the moving element 33A, a controlled force in the +Y-direction or in the −Y-direction acts on the movable rod 35A as shown by a double-headed arrow in FIG. 3.

Similarly, a second movable rod 35B is fixedly mounted on another of the four sides of the first column 24 facing toward the +X-direction, and a second actuator 32B having the same construction as the actuator 32A is provided between the second movable rod 35B and a second stationary bracket 31B fixedly mounted on the floor 1. By the commands from the controller 11, a controlled force in the +Y-direction or in the −Y-direction acts on the movable rod 35B acts on the movable rod 35B. In addition, a third actuator 32C is provided between one of the four sides of the first column 24 facing toward the +X-direction and a third stationary bracket 31C fixedly mounted on the floor 1. The actuator 32C comprises a stationary element 34C and a moving element 33C. By the commands from the controller 11, a controlled force in the +X-direction or in the −X-direction acts on the first column 24 from the actuator 32C.

Referring again to FIG. 1, the stationary brackets 31A, 31B and 31C are fixedly mounted on the floor 1 beside the first column 24. In FIG. 1, the center of gravity of the system composed of the platen 6, the wafer stage 20, the wafer holder 21, the first column 24, the projection optical system 25, the second column 26 and the reticle stage 27 is indicated by point G. Further, the acting points AP and BP in the figure indicate the points on the first column 24 at which the actuators 32A ad 32B imposes forces on the first column 24 through the movable rods 35A and 35B, respectively, and the acting point CP in the figure indicates the point on the first column 24 at which the actuator 32C imposes a force on the first column 24 through its moving element 34C. As clearly shown in FIG. 1, according to this embodiment, the positions in the Z-direction (or the heights) of the acting points AP, BP and CP are selected to be equal to that of the center of gravity G (i.e., the acting points AP, BP and CP and the center of gravity G are at the same level).

In the following, operation of the apparatus of this embodiment will be described.

In this embodiment, the illumination optical system 37 and the exposure machine main portion 29 are supported by the separate support structures, i.e., the illumination optical system 37 is supported by an independent column 36C while the exposure machine main portion 29 is supported by the combination of the platen 6 and the first and second columns 24 and 26. Therefore, any vibrations and shakings of the illumination optical system 37 generated for example by the activation of the cooling fan 43 or other components mounted on the illumination optical system 37, will not be transferred to the exposure machine main portion 29. In a conventional arrangement of a projection exposure apparatus, the vibrations and shakings of the illumination optical system are directly transferred to the main portion of the exposure apparatus, so that they may adversely influence upon the alignment accuracy between the reticle and the wafer. In contrast, according to the present invention, any vibrations and shakings of the illumination optical system 37 will never deteriorate the alignment accuracy between the reticle 28 and the wafer 22.

Further, the exposure machine main portion 29, carrying the wafer stage 20 and the reticle stage 27 which inherently require a quick control response, may have a higher natural frequency by virtue of the separation of the illumination optical system 27 from the exposure machine main portion 29, so that the control response frequencies of the wafer stage 20 and the reticle stage 22 may be selected to higher frequencies.

Nevertheless, even in the case where the illumination optical system 37 and the exposure machine main portion 29 are supported by separate support structures, the alignment between the illumination optical system 37 and the exposure machine main portion 29 may be lost by some cause such as shakings produced by the movement of the reticle stage 27 and/or the wafer stage 21 occurring in the exposure machine main portion 29, resulting in a possible failure to illuminate the entire pattern area on the reticle 28 with the illumination beam IL. Further, there may occur not only a translational misalignment but also an angular misalignment (or tilting misalignment) which may deteriorate the telecentricity of the illumination optical system 37, resulting in a reduced exposure accuracy. In order to account for this, the projection exposure apparatus of this embodiment is provided with the capacitance type sensors 44A and 44B for determining the relative position of the illumination optical system 37 and the exposure machine main portion 29. The vibration isolators supporting the exposure machine main portion 29 are controlled based on the measurements from the capacitance type sensors 44A and 44B, such that the relative position of the illumination optical system 37, and the exposure machine main portion 29 may be maintained at a fixed relative position. This is described in more detail below.

First of all, a precise control is performed so as to achieve the alignment between the optical axis AX1 of the illumination optical system 37 and the optical axis AX2 of the projection optical system 25 in the exposure machine main portion 29. Thereafter, during the actual operation (the exposure operation), a continuous control is performed so as to maintain the alignment between the optical axis AX1 of the illumination optical system 37 and the optical axis AX2, by appropriately activating the height adjustors 3A–3D and the actuators 7A–7D and 32A–32C.

Upon the actual operation, the misalignment and the distance between the illumination optical system 37 and the exposure machine main portion 29 shown in FIG. 1 are detected by the capacitance type sensors 44A and 44B, and the measured values from the sensors 44A and 44B are supplied to the controller 11. The controller 11 uses the measured values to set the initial settings for the control of the position and orientation of the exposure machine main portion 29. In the exposure machine main portion 29, as shown in FIGS. 1 and 3, the reaction forces acting on the platen 6 from the vibration isolators 4A–4D are measured by the load sensors 5A–5D, and the measured values are supplied to the controller 11. In addition, the tilt angle of the platen 6 measured by the level sensor 23 relative to a horizontal plane and the height of the platen 6 measured by the displacement sensor 10 are notified to the controller 11. The controller 11 uses these data so as to calculate the desired heights of the respective vibration isolators 4A–4D required to set the height and the tilt angle of the platen 6 to the preset initial settings. For the purpose, the desired heights of the respective vibration isolators 4A–4D are determined such that the resultant balance of the reaction forces acting on the platen 6 from the vibration isolators 4A–4D will be a predetermined balance. The controller 11 then operates the height adjustors 3A–3D so as to set the heights of the respective vibration isolators 4A–4D to the calculated, desired heights.

Thereafter, during the actual operation, any misalignment and the distance between the illumination optical system 37 and the exposure machine main portion 29 are continuously measured by means of the capacitance type sensors 44A and 44B and the measured values from the sensors 44A and 44B are supplied to the controller 11. The controller 11 uses the measured values to adjust the heights of the vibration isolators 4A–4D. In this manner, the relative position of the illumination optical system 37 and the exposure machine main portion 29 is controlled and maintained at a fixed relative position. As the result that the positioning accuracy of the wafer stage 20 on the platen 6 may be maintained at a high level.

Further, as shown in FIG. 3, the data representing the accelerations in the six-degree-of-freedom motion, as detected by means of the acceleration sensor 30 on the platen 6,,is supplied to the controller 11. The controller operates the four Z-direction actuators 7A–7D, the two Y-direction actuators 32A and 32B and the one X-direction actuator 32C, such that the acceleration components in the six-degree-of-freedom motion are to be reduced to zeros. In this manner, any six-degree-of-freedom shakings of the exposure machine main portion 29 comprising the platen 6 and the components mounted on the platen 6 may be effectively suppressed. Therefore, any temporary misalignment between the illumination optical system 37 and the exposure machine main portion 29 as caused by the shakings of the latter may be quickly vanished.

In this relation, it is to be noted that the acting points AP, BP and CP on the "mass" in the oscillation system (the mass is the combination of the platen 6 and the components mounted on the platen 6, which is the subject of the oscillation suppression), at which the forces from the two actuators 32A and 32B for the Y-axis control and the actuator 32C for the X-axis control act on the mass, are selected to the same Z-direction position (at the same height) as the point G of the center of gravity of the mass, as previously described. As the result that the rotational motion about the Z-axis as well as the translational motions in the X- and Y-directions of the mass may be controlled by the X-axis actuator 32C and the Y-axis actuators 32A and 32B without any rotational motions about the X- or Y-axis induced by the control by these actuators, so that the inter-axis interference (interference between the control operations performed with respect to different axes), if any, may be suppressed to a minimum.

Further, in the embodiment described above, the acting point CP of the X-axis actuator 32C and the acting points AP and BP of the Y-axis actuators 32A and 32B are selected to be level with the point G of the center of gravity of the "mass"; however, this is not always a decisive requisite. In fact, if some inter-axis interference is allowable, the acting points AP, BP and CP may be selected to the positions not level with the point G of the center of gravity of the "mass". Further, only the acting point CP of the X-axis actuator 32C may be selected to be substantially level with the point G of the center of gravity of the "mass".

Figure 4:
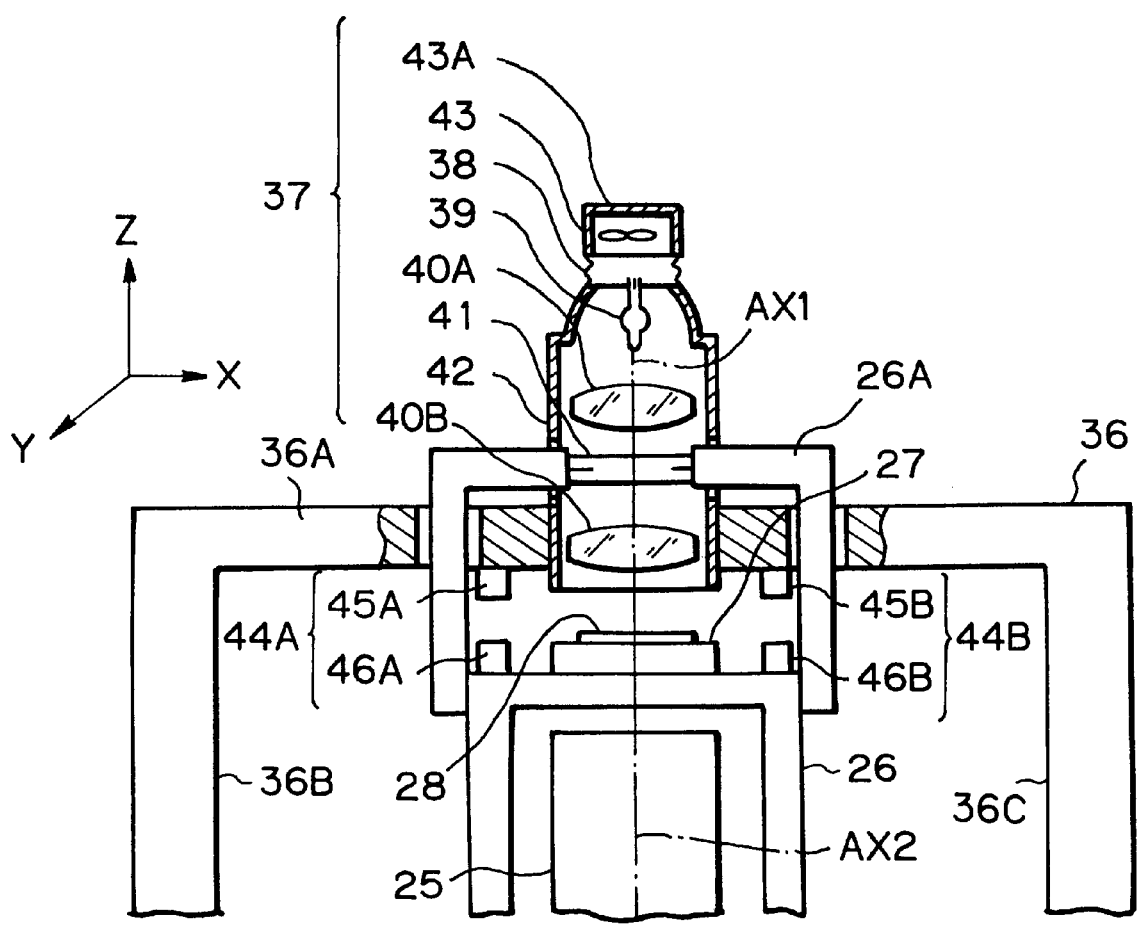
FIG. 4 is a schematic elevation, partially cutaway, showing a critical portion of an exposure apparatus in accordance with a modification to the embodiment of FIG. 1.

Referring next to FIG. 4, a modification to the exposure apparatus of FIG. 1 will be described. The modified features comprise the separation of the reticle blind (field stop) 41 of the illumination optical system 37 (see FIG. 1) from the remaining portion of the illumination optical system 37 and the mounting of the reticle blind 41 on one of the columns in the exposure machine main portion 29. In the following description and in FIG. 4, corresponding components and elements are designated by the same reference numerals as in FIG. 1 and will not be described in detail.

FIG. 4 shows the arrangement of the relevant portion of the exposure apparatus of the modified embodiment. As shown in FIG. 4, the entire illumination optical system 37 but the reticle blind 41 is fixedly mounted on the support plate 36A of the independent column 36 as with the embodiment of FIG. 1. The reticle blind 41, though confined in the illumination system lens barrel 42, is not mounted on the illumination system lens barrel 42 but is supported by a pair of brackets 26A extending through the side walls of the illumination system lens barrel 42 from the opposite sides thereof. The brackets 26A have respective legs extending vertically through respective holes 36D formed in the independent column 36 and fixedly connected to the second column 26 which carries the reticle stage 27. In this manner, the reticle blind 41 is fixedly mounted on the exposure machine main portion 29.

In this modified embodiment, since the reticle blind 41 is fixed to the exposure machine main body 29, the relative position of the reticle blind 41 to any of the reticle 28, the projection optical system 25 and the wafer 22 will remain unchanged even when the alignment between the remaining portion of the illumination optical system 37 and the exposure machine pain portion 29 is lost, resulting in a stable illumination field defined on the reticle 28.

In the embodiment of FIG. 1, the entire illumination optical system 37 is mounted on the separate support structure (i.e., the independent column 36) which is separate from the support structure for the exposure machine main body 29. A further, alternative modified embodiment is contemplated, in which the illumination optical system 37 is divided into an upper portion including the light source 39 and the cooling fan 39 and a lower portion including the components disposed below the light source 39, and the upper portion is supported on the separate support structure such as described above while the lower portion is supported on the support structure for the exposure machine main portion 29. In this arrangement, no temporary misalignment between the optical axes AX1 and AX2 of the illumination optical axis 37 and the projection optical system 25 of the exposure machine main portion 29 can occur, so that the relative position of the two support structures need not be measured with critical precision.

The embodiments described above are exemplified applications of the present invention to stepper type of project on exposure apparatuses; however, the present invention has its applicability not limited to this type of projection exposure apparatus but may be applied to the projection exposure apparatuses using the scanning projection technique such as of the step-and-scan type. The support structure having the actuators provided for suppressing the oscillations of the platen 6, as used in each embodiments described above, is particularly useful for the scanning projection exposure apparatus which tends to produce large accelerations when each stroke of the scanning exposure operation starts and ends. Further, the modified embodiment of FIG. 4 can provide a stable stage illumination field even if relatively large shakings occur, so that its arrangement is more advantageous when used for the scanning projection exposure apparatus which tends to produce relatively large shakings. As known, scanning projection exposure apparatuses often include a variable field stop for preventing the undesirable exposure of that portion on the wafer which is not to be exposed but would be exposed at the start and the end of each stroke of the scanning exposure operation if no such variable stop is provided. It is preferable that such variable field stop be mounted on the exposure machine main portion.

In the embodiment of FIG. 1, the actuators 7A–7D for the Z-direction control are provided in addition to the height adjustors 3A–3D; however, the actuators 7A–7D may be omitted and the height adjustors 3A–3D may be used to provide the functions of the actuators. Nevertheless, the use of the actuators 7A–7D disposed in parallel to the vibration isolators 4A–4D provides an advantage that the shakings of the platen 6 may be suppressed with a high response speed and with a relatively small force required for the suppression. Further, five or more vibration isolators may be used, and more than six-degree-of-freedom actuators may be used.

As understood, the present invention is not limited to the embodiments shown and described above, but various other arrangements and modifications can be made without departing the spirit and the scope of the present invention.

According to the exposure apparatus of the present invention, the illumination optical system and the exposure machine main portion are separated from each other by using the separate support structures, so as to provide an advantage that any vibrations of the illumination optical system are effectively prevented from being transferred to the exposure machine main portion. Therefore, any shakings and the vibrations of the illumination optical system will not influence upon the measurement for the alignment between the mask and the photosensitized substrate, and the alignment can be achieved with precision. Further, the exposure machine main portion, carrying the wafer stage and the reticle stage which inherently require a quick control response, may have a higher natural frequency by virtue of the arrangement in which the illumination optical system is mounted on the support structure separate from the exposure machine main portion, so that there is obtained an advantage that the control response frequencies of the wafer stage and the reticle stage may be selected to higher frequencies than those obtainable by conventional exposure apparatuses.

Moreover, in the case where the support structure on which the exposure machine main portion is mounted comprises a vibration isolation structure capable of six-degree-of-freedom position and orientation control, where the exposure apparatus further comprises a position detection mechanism for detecting any misalignment between the illumination optical system and the exposure machine main portion, and where the position and orientation of the vibration isolation structure are controlled based on detected values from the position detection mechanism, then, the position detection means can be used to measure any misalignment between the illumination optical system and the exposure machine main portion, and the vibration isolation structure having six-degree-of-freedom can be used to control the position and orientation of the exposure machine main portion with precision so as to correct any misalignment between the exposure machine main portion and the illumination optical system.

In addition, in the case where the illumination optical system further comprises a field stop for limiting an illumination area on the mask and the field stop is fixedly mounted on the exposure machine main portion, there is provided an advantage that the relative position of the field stop and the exposure machine main portion remains unchanged even when a misalignment occur between the illumination optical system and the exposure machine main portion, so that the illumination area can be maintained stationary.

What is claimed is:

1. An exposure apparatus for transferring a pattern formed on a mask onto a photosensitized substrate, comprising:
    an illumination optical system having at least an optical member, for illuminating said mask with an illumination beam from an illumination light source;
    an exposure machine main portion, located on a floor, which supports at least said mask and said photosensitized substrate, said exposure machine main portion connected to actuating members capable of actuating said exposure machine main portion so as to suppress a displacement of said exposure machine main portion; and
    an illumination support structure, located on a floor, on which said illumination optical system is mounted, which is separated from said machine main portion.

2. An exposure apparatus according to claim 1, further comprising:
    a position detection mechanism for detecting any misalignment between said illumination optical system and said exposure machine main portion,
    wherein said actuating member is controlled in accordance with the output of said position detection mechanism.

3. An exposure apparatus according to claim 1, wherein:
    said illumination optical system further comprises a field stop for limiting an illumination area on said mask, said field stop being fixedly mounted on said exposure machine main portion.

4. An exposure apparatus according to claim 1, wherein:
    said illumination optical system further comprises a field stop for limiting an illumination area on said mask and a lens for shaping said illumination beam, said field stop and said lens being fixedly mounted on said exposure machine main portion.

5. An exposure apparatus according to claim 1, wherein:
    said actuating member includes vertical actuating members which actuate the vertical-axis position of said exposure machine main portion.

6. An exposure apparatus according to claim 1, further comprising:
    an acceleration sensor capable of detecting the accelerations in the up and down motion,
    wherein said actuating member is controlled in accordance with the output of said acceleration sensor.

7. An exposure apparatus according to claim 1, wherein:
    said illumination optical system includes at least a relay lens and a condenser lens.

8. An exposure apparatus according to claim 1, wherein:
    said actuating member includes horizontal actuating members which actuate the horizontal-axis position of said exposure machine main portion.

9. An exposure apparatus according to claim 8, wherein:
    said horizontal actuating members have at least three acting points, said three acting points being selected to be equal to the heights of the center of gravity of said exposure machine main portion.

10. An exposure apparatus according to claim 1, wherein:
    said exposure machine main portion and said actuating members are connected to each other mechanically or magnetically.

11. An exposure apparatus according to claim 1, wherein:
    said illumination support structure supports said illumination source.

12. An exposure apparatus according to claim 1, further comprising:
    a movable mask stage that holds said mask; and
    a movable substrate stage that holds said photosensitized substrate.

13. An exposure apparatus according to claim 12, wherein said actuating member suppresses a displacement of said exposure machine main portion caused by a movement of at least one of said movable mask stage and said movable substrate stage.

14. An exposure apparatus according to claim 1, wherein said actuating member comprises a coil member and a magnet member.

15. An exposure apparatus according to claim 1, wherein said actuating member comprises a fluid type actuator and an electric type actuator.

16. An exposure apparatus according to claim 1, wherein said exposure apparatus is a step-and-scan type exposure apparatus.

17. An exposure apparatus for transferring a pattern formed on a mask onto a photosensitized substrate through a projection optical system, comprising:
    an illumination optical system having at least an optical member and a field stop that defines an illumination area on said mask;
    an exposure machine main portion, which has at least a base support member which includes said photosensitized substrate, a first support structure which includes said projection optical system, and a second support structure which includes said mask mounted on said first support structure;
    an illumination support structure, located on the floor, on which said illumination optical system is mounted, which is separated from said exposure machine main portion; and
    an actuating member capable of actuating said exposure machine main portion along an optical axis of said projection optical system.

18. An exposure apparatus according to claim 17, further comprising:
    a position detection mechanism for detecting any misalignment between said illumination optical system and said exposure machine main portion,
    wherein said actuating member is controlled in accordance with the output of said position detection mechanism.

19. An exposure apparatus according to claim 17, further comprising:
    an acceleration sensor capable of detecting the accelerations in the up and down motion mounted on said exposure machine main portion,
    wherein said actuating member is controlled in accordance with the output of said acceleration sensor.

20. An exposure apparatus for transferring a pattern formed on a mask onto a photosensitive substrate, comprising:
- an illumination optical system including at least an exposure illumination light source and condenser lens for illuminating said mask through said condenser lens with an illumination beam from said illumination light source;
- an exposure machine main portion including at least a reticle stage for mounting said mask and a stage for mounting said photosensitive substrate;
- first and second support structures, said illumination optical system mounted on said first support structure and said exposure machine main portion mounted on said second support structure, said first support structure being separate and not fixed to said second support structure; and
- a first sensor that detects a mutual position between said first support structure and said second support structure and outputs a signal regarding said mutual position.

21. The exposure apparatus according to claim 20, wherein said illumination optical system includes a field stop positioned between said exposure illumination light source and said condenser lens.

22. The exposure apparatus according to claim 21, wherein said field stop is fixed to said second support structure.

23. The exposure apparatus according to claim 20, further comprising:
- an actuator for actuating said first support structure or said second support structure in accordance with said signal.

24. The exposure apparatus according to claim 20, wherein said actuator is fixed to said second support structure.

25. A method of manufacturing an exposure apparatus for transferring a pattern formed on a mask onto a photosensitized substrate, comprising:
- providing an illumination optical system having at least an optical member, for illuminating said mask with an illumination beam from an illumination light source;
- providing an exposure machine main portion, located on a floor, which supports at least said mask and said photosensitized substrate, said exposure machine main portion connected to an actuating member capable of actuating said exposure machine main portion so as to suppress a displacement of said exposure machine main portion; and
- providing an illumination support structure, located on a floor, on which said illumination optical system is mounted, which is separated from said exposure machine main portion.

26. A method according to claim 25, further comprising:
providing a position detection mechanism for detecting any misalignment between said illumination optical system and said exposure machine main portion.

27. A method according to claim 25, further comprising:
providing an acceleration sensor capable of detecting the accelerations in the motion.

28. A method according to claim 25, wherein:
said actuating member includes vertical actuating members which actuate the vertical-axis position of said exposure machine main portion and horizontal actuating members which actuate the horizontal-axis position of said exposure machine main portion.

29. A method according to claim 25, wherein:
said exposure machine main portion and said actuating member are connected to each other mechanically or magnetically.

30. A method according to claim 25, wherein:
said illumination support structure supports said illumination source.

31. A method according to claim 25, further comprising:
providing a movable mask stage that holds said mask; and
providing a movable substrate stage that holds said photosensitized substrate.

32. A method according to claim 31, wherein said actuating member suppresses a displacement of said exposure machine main portion caused by a movement of at least one of said movable mask stage and said movable substrate stage.

33. A method according to claim 25, wherein said actuating member comprises a coil member and a magnet member.

34. A method according to claim 25, wherein said actuating member comprises a fluid type actuator and an electric type actuator.

35. A method according to claim 25, wherein said exposure apparatus is a step-and-scan type exposure apparatus.

36. A method of manufacturing an exposure apparatus for transferring a pattern formed on a mask onto a photosensitized substrate through a projection optical system comprising:
- providing an illumination optical system having at least an optical member and a field stop that defines an illumination area on said mask;
- providing an exposure machine main portion, located on a floor, which has at least a base support member which includes said photosensitized substrate, a first support structure which includes said projection optical system, and a second support structure which includes said mask mounted on said first support structure;
- providing an illumination support structure, located on the floor, on which said illumination optical system is mounted, which is separated from said exposure machine main portion; and
- an actuating member capable of actuating said exposure machine main portion along an optical axis of said projection optical system.

37. A method according to claim 36, further comprising:
providing a position detection mechanism for detecting any misalignment between said illumination optical system and said exposure machine main portion, wherein said actuating member is controlled in accordance with the output of said position detection mechanism.

38. A method according to claim 36, further comprising:
providing an acceleration sensor capable of detecting the accelerations in the motion mounted on said exposure machine main portion, wherein said actuating member is controlled in accordance with said acceleration sensor.

39. A method of manufacturing an exposure apparatus for transferring a pattern formed on a mask onto a photosensitized substrate through a projection optical system comprising:
- providing an illumination optical system having at least an exposure illumination light source and a condenser lens, for illumination said mask through said condenser lens with an illumination beam from said illumination light source;

providing an exposure machine main portion including at least a reticle stage for mounting said mask and a stage for mounting said photosensitized substrate;

providing a first and second support structure, said illumination optical system mounted on said first support structure and said exposure machine main portion mounted on said second support structure, said first support structure being separate and not fixed to said second support structure; and providing a first sensor that detects a mutual position between said first support structure and said second support structure and outputs a signal regarding said mutual position.

40. A method according to claim 39, further comprising:
providing a first sensor for detecting a mutual position between said first support structure and said second support structure and for outputting a signal regarding said mutual position.

41. A method according to claim 39, further comprising:
an actuator for actuating said first support structure or said second support structure in accordance with said signal.

42. A method of manufacturing an exposure apparatus which has an illumination source which emits an illumination beam and a projection system which transfers a pattern formed on a mask onto a substrate, comprising:

providing an illumination system, disposed between said mask and said illumination source, which illuminates said mask with said illumination beam;

providing an exposure machine main portion which supports at least one of said mask, said substrate and said projection system;

providing an actuating member capable of suppressing a motion of said exposure machine main portion, at least part of said actuator member being on said exposure machine main portion; and providing an illumination support structure on which said illumination system is mounted, which is separated from said exposure machine main portion.

43. A method according to claim 42, further comprising:
providing a position detection mechanism which detects any misalignment between said illumination system and said exposure machine main portion,
wherein said actuating member is controlled in accordance with the output of said position detection mechanism.

44. A method according to claim 42, further comprising:
providing a field stop which limits an illumination area on said mask mounted on said exposure machine main portion.

45. A method according to claim 42, further comprising:
providing a field stop which limits an illumination area on said mask and a lens which shapes said illumination beam, said field stop and said lens which are mounted on said exposure machine main portion.

46. A method according to claim 42, wherein said motion is an oscillation or an inclination of said exposure machine main portion.

47. A method according to claim 42, wherein said actuating member actuates a position of said exposure machine main portion.

48. A method according to claim 42, wherein said actuating member includes a vertical actuating member which actuates the vertical-axis position of said exposure machine main portion.

49. A method according to claim 42, wherein said actuating member includes a horizontal actuating member which actuates the horizontal-axis position of said exposure machine main portion.

50. A method according to claim 49, wherein said horizontal actuating member has at least three acting points, the position of said three acting points are selected to be equal to the heights of the center of gravity of said exposure machine main portion.

51. A method according to claim 42, further comprising:
providing a sensor capable of detecting a motion of said exposure machine main portion,
wherein said actuating member is controlled in accordance with the output of said sensor.

52. A method according to claim 51, wherein said sensor detects an acceleration.

53. A method according to claim 51, wherein said sensor detects a displacement.

54. A method according to claim 42, wherein said illumination system includes at least a relay lens and a condenser lens.

55. A method according to claim 42, wherein said illumination system includes an illumination optical system.

56. A method according to claim 42, wherein said exposure machine main portion and said illumination support structure are located on a foundation.

57. A method according to claim 56, wherein said foundation includes a floor.

58. A method according to claim 42, wherein said exposure machine main portion is located on an isolator, and said illumination support structure is separated from said exposure machine main portion by said isolator.

59. A method of manufacturing an exposure apparatus which has an illumination source which emits an illumination beam and a projection system which transfers a pattern formed on a mask onto a substrate, comprising:

providing an illumination optical system that includes at least a condenser lens, which illuminates said mask through said condenser lens with said illumination beam;

providing an exposure machine main portion which includes at least one of said mask, said substrate and said projection optical system, said exposure machine main portion being located on an isolator; and providing an illumination support structure on which said illumination optical system is mounted, which is separated from said exposure machine main portion by said isolator.

60. A method according to claim 59, wherein said exposure machine main portion and said illumination support structure are located on a foundation.

61. A method according to claim 60, wherein said foundation includes a floor.

62. A method according to claim 59, wherein said illumination optical system includes a field stop positioned between an exposure illumination light source and said condenser lens.

63. A method according to claim 59, wherein said exposure machine main portion has an actuating member capable of suppressing a motion of said exposure machine main portion.

64. A method according to claim 63, further comprising:
providing a sensor which detects a mutual position between said illumination support structure and said exposure machine main portion, and which outputs a signal regarding said mutual position.

65. A method according to claim 63, further comprising:
providing a sensor capable of detecting a motion of said exposure machine main portion,
wherein said actuating member is controlled in accordance with the output of said sensor.

66. A method according to claim 65, wherein said sensor detects an acceleration.

67. A method according to claim 65, wherein said sensor detects a displacement.

68. A method for manufacturing an exposure apparatus which has an illumination source which emits an illumination beam and a projection system which transfers a pattern formed on a mask onto a substrate, comprising:
providing an illumination system, disposed between said illumination source and said mask, which illuminates said mask with said illumination beam;
providing an exposure machine main portion which supports at least one of said mask, said substrate and said projection system, said exposure machine main portion using a step-and-scan projection technique; and
providing an illumination support structure on which said illumination system is mounted, which is separated from said exposure machine main portion.

69. A method according to claim 68, wherein said exposure machine main portion has an actuating member capable of suppressing a motion of said exposure machine main portion.

70. A method according to claim 69, further comprising:
providing a position detection mechanism which detects any misalignment between said illumination system and said exposure machine main portion,
wherein said actuating member is controlled in accordance with the output of said position detection mechanism.

71. A method according to claim 68, further comprising:
providing a field stop which limits an illumination area on said mask mounted on said exposure machine main portion.

72. A method according to claim 68, further comprising:
providing a field stop which limits an illumination area on said mask and a lens which shapes said illumination beam, said field stop and said lens being mounted on said exposure machine main portion.

73. A method according to claim 68, wherein said motion is an oscillation or an inclination of said exposure machine main portion.

74. A method according to claim 69, wherein said actuating member actuates a position of said exposure machine main portion.

75. A method according to claim 74, wherein said actuating member includes a vertical actuating member which actuates the vertical-axis position of said exposure machine main portion.

76. A method according to claim 74, wherein said actuating member includes a horizontal actuating member which actuates the horizontal-axis position of said exposure machine main portion.

77. A method according to claim 76, wherein said horizontal actuating member has at least three acting points, the position of said three acting points are selected to be equal to the heights of the center of gravity of said exposure machine main portion.

78. A method according to claim 69, further comprising:
providing a sensor capable of detecting a motion of said exposure machine main portion,
wherein said actuating member is controlled in accordance with the output of said sensor.

79. A method according to claim 78, wherein said sensor detects an acceleration.

80. A method according to claim 78, wherein said sensor detects a displacement.

81. A method according to claim 68, wherein said illumination system includes at least a relay lens and a condenser lens.

82. A method according to claim 68, wherein said illumination system includes an illumination optical system.

83. A method according to claim 68, wherein said exposure machine main portion and said illumination support structure are located on a foundation.

84. A method according to claim 83, wherein said foundation includes a floor.

85. A method according to claim 68, wherein said exposure machine main portion is located on an isolator, and said illumination support structure is separated from said exposure machine main portion by said isolator.

86. A method according to claim 68, wherein said exposure machine main portion supports said projection optical system and said mask.

87. A method according to claim 86, wherein said exposure machine main portion supports said projection optical system, said mask, and said substrate.

88. An exposure apparatus which transfers a pattern of a mask onto an object, comprising:
an illumination system which illuminates said mask with an exposure beam, said illumination system having a first illumination portion and a second illumination portion;
an exposure device which transfers said pattern onto said object by a step-and-scan technique;
a first support structure which supports said exposure device and either said first illumination portion or said second illumination portion; and
a second support structure which supports the other of said first illumination portion and said second illumination portion, said second structure being separated from said first support structure.

89. An exposure apparatus according to claim 88, wherein:
said first illumination portion comprises a field stop that limits an illumination area on said mask.

90. An exposure apparatus according to claim 89, wherein:
said first support structure supports said first illumination portion.

91. An exposure apparatus according to claim 88, further comprising:
an actuator capable of actuating said first support structure and connected to said first support structure.

92. An exposure apparatus according to claim 91, wherein said actuator includes a vertical actuating member which actuates the vertical-axis position of said first support structure.

93. An exposure apparatus according to claim 91, wherein said actuator includes a horizontal actuating member which actuates the horizontal-axis position of said first support structure.

94. An exposure apparatus according to claim 88, wherein:

said exposure device comprises a projection lens system which is disposed between said mask and said object.

95. An exposure apparatus according to claim 94, wherein:

said exposure device comprises a mask stage that holds said mask.

96. An exposure apparatus according to claim 88, further comprising:

a position detector that detects any misalignment between said illumination system and said exposure device.

97. An exposure apparatus according to claim 96, wherein:

said position detector comprises a non-contact sensor.

98. An exposure apparatus according to claim 88, wherein said second illumination portion comprises a field stop that defines an illumination area on said mask.

99. An exposure apparatus according to claim 88, wherein said first illumination portion comprises a light source and said second illumination portion comprises a field stop that defines an illumination area on said mask.

100. An exposure apparatus according to claim 88, wherein said first illumination portion comprises an optical member and said second illumination portion comprises a field stop that defines an illumination area on said mask.

101. An exposure apparatus according to claim 95, wherein said exposure device comprises a substrate stage that holds said object.

* * * * *